(12) United States Patent
Yoon

(10) Patent No.: US 10,304,757 B2
(45) Date of Patent: May 28, 2019

(54) SENSOR PACKAGING USING A LOW-TEMPERATURE THROUGH-SILICON VIA (TSV) TECHNOLOGY AND METHOD FOR MANUFACTURING THE SAME

(71) Applicant: Industry-University Cooperation Foundation Hanyang University, Seoul (KR)

(72) Inventor: Sang Won Yoon, Seoul (KR)

(73) Assignee: Industry-University Cooperation Foundation Hanyang University, Seoul (KR)

( * ) Notice: Subject to any disclaimer, the term of this patent is extended or adjusted under 35 U.S.C. 154(b) by 0 days.

(21) Appl. No.: 15/573,955

(22) PCT Filed: May 13, 2016

(86) PCT No.: PCT/KR2016/005106
§ 371 (c)(1),
(2) Date: Nov. 14, 2017

(87) PCT Pub. No.: WO2016/182395
PCT Pub. Date: Nov. 17, 2016

(65) Prior Publication Data
US 2018/0294209 A1    Oct. 11, 2018

(30) Foreign Application Priority Data

May 14, 2015   (KR) ........................ 10-2015-0067630

(51) Int. Cl.
*H01L 23/48*     (2006.01)
*H01L 23/00*     (2006.01)
(Continued)

(52) U.S. Cl.
CPC ...... *H01L 23/481* (2013.01); *H01L 21/02118* (2013.01); *H01L 21/3065* (2013.01);
(Continued)

(58) Field of Classification Search
CPC .............. H01L 21/6835; H01L 23/481; H01L 21/76898
See application file for complete search history.

(56) References Cited

U.S. PATENT DOCUMENTS

| | | | | |
|---|---|---|---|---|
| 7,786,390 B2 * | 8/2010 | Ikeda | ..................... | H05K 1/119 |
| | | | | 174/255 |
| 8,933,473 B1 * | 1/2015 | Dubin | ................... | H01L 25/167 |
| | | | | 257/79 |

(Continued)

FOREIGN PATENT DOCUMENTS

| KR | 10-2005-0000184 A | 1/2005 |
|---|---|---|
| KR | 10-2012-0012602 A | 2/2012 |
| KR | 10-1312593 B1 | 9/2013 |

OTHER PUBLICATIONS

International Search Report of PCT/KR2016/005106 dated Aug. 18, 2016.

*Primary Examiner* — Quoc D Hoang
(74) *Attorney, Agent, or Firm* — Sughrue Mion, PLLC

(57) ABSTRACT

A method for manufacturing a sensor packaging according to an exemplary embodiment of the present disclosure includes: forming a via hole penetrating a main substrate by etching each of both surfaces of the main substrate; forming an insulating layer on a wall surface of the via hole and the both surfaces of the main substrate; combining a sub-substrate on which a metallic seed layer and a bonding layer having a pattern for exposing a part of the seed layer are laminated with the main substrate; forming a filling layer configured to cover an upper surface of the main substrate by filling metal in the via hole; and removing the sub-substrate from the main substrate.

9 Claims, 10 Drawing Sheets

(51) Int. Cl.
   *H01L 21/02*      (2006.01)
   *H01L 21/3065*    (2006.01)
   *H01L 21/683*     (2006.01)
   *H01L 21/768*     (2006.01)
   *G01D 11/26*      (2006.01)
   *H01L 21/321*     (2006.01)

(52) U.S. Cl.
   CPC .... *H01L 21/6835* (2013.01); *H01L 21/76831* (2013.01); *H01L 21/76871* (2013.01); *H01L 21/76877* (2013.01); *H01L 21/76898* (2013.01); *H01L 23/00* (2013.01); *H01L 23/48* (2013.01); *G01D 11/26* (2013.01); *H01L 21/3212* (2013.01); *H01L 21/7684* (2013.01); *H01L 2221/68359* (2013.01)

(56)    References Cited

U.S. PATENT DOCUMENTS

| | | |
|---|---|---|
| 9,275,934 B2 * | 3/2016 | Sundaram .............. H01L 21/486 |
| 2006/0046432 A1 | 3/2006 | Sankarapillai et al. |
| 2006/0292866 A1 | 12/2006 | Borwick et al. |
| 2012/0028412 A1 | 2/2012 | Jeong et al. |

* cited by examiner

SENSOR PACKAGING USING A LOW-TEMPERATURE THROUGH-SILICON VIA (TSV) TECHNOLOGY AND METHOD FOR MANUFACTURING THE SAME

CROSS REFERENCE TO RELATED APPLICATIONS

This application is a National Stage of International Application No. PCT/KR2016/005106 filed May 13, 2016, claiming priority from Korean Patent Application No. 10-2015-0067630 filed May 14, 2015, the contents of all of which are incorporated herein by reference in their entirety.

TECHNICAL FIELD

The exemplary embodiments of the present invention relate to a sensor packaging and a method for manufacturing the same, and more particularly to a sensor packaging using a low-temperature Through-Silicon Via (TSV) technology for microsensor integration and a method for manufacturing the same.

BACKGROUND ART

A TSV technology refers to a packaging method for transmitting an electrical signal among a plurality of semiconductor chips by forming a via hole vertically penetrating the semiconductor chips when the semiconductor chips are laminated in a vertical direction. Due to the vertical integration, the entire system can be miniaturized, and due to the decrease in interconnection between chips, a high-integration, low-power, high-speed, and small-size packaging can be implemented.

Particularly, if a 3D System in Package (SiP) is implemented by applying the TSV technology to a SiP, an advantage of the SiP in terms of price can be maintained and the performance which is a relative disadvantage of the SiP compared with a System on Chip (SoC) can be improved.

There have been studies that attempt to utilize the TSV in integration of semiconductor sensor. In general, due to process characteristics, a semiconductor sensor chip is not processed as an ASIC driving circuit which is fabricated mainly through a CMOS process. Therefore, in most cases, a sensor chip and an ASIC chip are disposed horizontally in a sensor packaging and then connected to each other using a wirebond.

Such a horizontal integration method may cause an increase in size of the entire sensor system and requires a lot of processes and the wirebond itself is thin and long and thus cause an increase of a parasitic resistance/impedance, which has a great effect on the performance of a sensor. To solve this problem, a vertical integration method has been studied.

As such, technologies of integration in a vertical direction for size reduction and performance improvement are being actively developed, and particularly, the TSV technology has received the most attention. However, due to limitations of passivation and metal filling processes required for the TSV process, various problems such as a stress caused by heat occur.

Such problems restrict the utilization of a custom integrated circuit (custom IC) and decrease the degree of integration in a vertical process. Also, a sensor chip includes a wafer which is 5 to 10 times thicker than that of a system semiconductor or a memory chip in which the TSV is commonly used, and, thus, it is difficult to apply the general TSV technology to the sensor chip. Further, the sensor chip is very sensitive to contact resistance, and, thus, an operation of the sensor chip may be hampered by a parasitic resistance which is generated by a conventional thin and long TSV.

Accordingly, there is a need for a TSV technology specialized for sensor chips, a sensor packaging using the same, and a method for manufacturing the sensor packaging.

DISCLOSURE

Technical Problem

An exemplary embodiment of the present disclosure provides a TSV technology specialized for sensor chips by using a bidirectional etching process, and, thus, it is possible to provide a sensor packaging through a DRIE process for forming a through hole in a relatively thick sensor chip and a method for manufacturing the sensor packaging.

An exemplary embodiment of the present disclosure provides a sensor packaging and a method for manufacturing the sensor packaging in which a DRIE process can be simplified without specialization for reduction of scalloping in a DRIE process which is a serious problem for the general TSV.

An exemplary embodiment of the present disclosure provides a sensor packaging and a method for manufacturing the sensor packaging in which an insulating layer is formed on a silicon wafer using a low-temperature insulator process, and, thus, a good step coverage can be obtained.

An exemplary embodiment of the present disclosure provides a sensor packaging and a method for manufacturing the sensor packaging in which a thin metal layer is deposited on an upper surface of a handle wafer to be used as a seed layer by using a handle wafer process and parylene used as an insulating layer is used again to easily separate the handle wafer from a silicon wafer.

However, problems to be solved by the present disclosure are not limited to the above-described problems. Although not described herein, other problems to be solved by the present disclosure can be clearly understood by a person having ordinary skill in the art from the following description.

Technical Solution

A method for manufacturing a sensor packaging according to an exemplary embodiment of the present disclosure includes: forming a via hole penetrating a main substrate by etching each of both surfaces of the main substrate; forming an insulating layer on a wall surface of the via hole and the both surfaces of the main substrate; combining a sub-substrate on which a metallic seed layer and a bonding layer having a pattern for exposing a part of the seed layer are laminated with the main substrate; forming a filling layer configured to cover an upper surface of the main substrate by filling metal in the via hole; and removing the sub-substrate from the main substrate.

The forming of a via hole may include forming the via hole by performing Deep Reactive Ion Etching (DRIE) to each of an upper surface and a lower surface of the main substrate.

The wall surface of the via hole may be formed as a bent slanted surface.

The forming of an insulating layer may include forming the insulating layer using a polymer which is available for deposition at room temperature.

The polymer may include parylene.

The combining of a sub-substrate with the main substrate may include: preparing the sub-substrate on which the seed layer is deposited in advance; forming the bonding layer on the seed layer of the sub-substrate; forming a pattern by etching a part of the bonding layer; and combining the sub-substrate with the main substrate by aligning and bonding the bonding layer of the sub-substrate and the insulating layer of the main substrate such that the pattern matches with the via hole.

The bonding layer may be formed of a polymer including at least one of parylene, polydimethylsiloxane (PDMS), polymethyl methacrylate (PMMA), SU8, photoresist, and the like.

The pattern may be formed after or at the same time when the bonding layer is deposited on the seed layer.

The main substrate may include a silicon wafer, and the sub-substrate may include a handle wafer or a handle tape.

A sensor packaging according to an exemplary embodiment of the present disclosure includes: a via hole formed by penetrating both surfaces of a main substrate; an insulating layer formed on a wall surface of the via hole and the both surfaces of the main substrate; and a filling layer formed by being filled in the via hole, and the wall surface of the via hole is formed as a bent slanted surface.

The insulating layer may include a polymer which is available for deposition at room temperature.

The polymer may include parylene.

Details of other exemplary embodiments will be included in the detailed description and the accompanying drawings.

Advantageous Effects

According to an exemplary embodiment of the present disclosure, there is provided a TSV technology specialized for sensor chips by using a bidirectional etching process. Thus, a DRIE process can be simplified. Therefore, a general DRIE process which is not specialized for reduction of scalloping can be used.

According to an exemplary embodiment of the present disclosure, an insulating layer is formed on a silicon wafer using a low-temperature insulator process, and, thus, a TSV is generated at low temperature. Therefore, a thermal stress caused by high temperature can be solved and a good step coverage can be obtained.

According to an exemplary embodiment of the present disclosure, a thin metal layer is deposited on an upper surface of a handle wafer to be used as a seed layer by using a handle wafer process and a polymer is used for the insulating layer to easily separate the handle wafer from the silicon wafer.

BEST MODE

Figure 1:
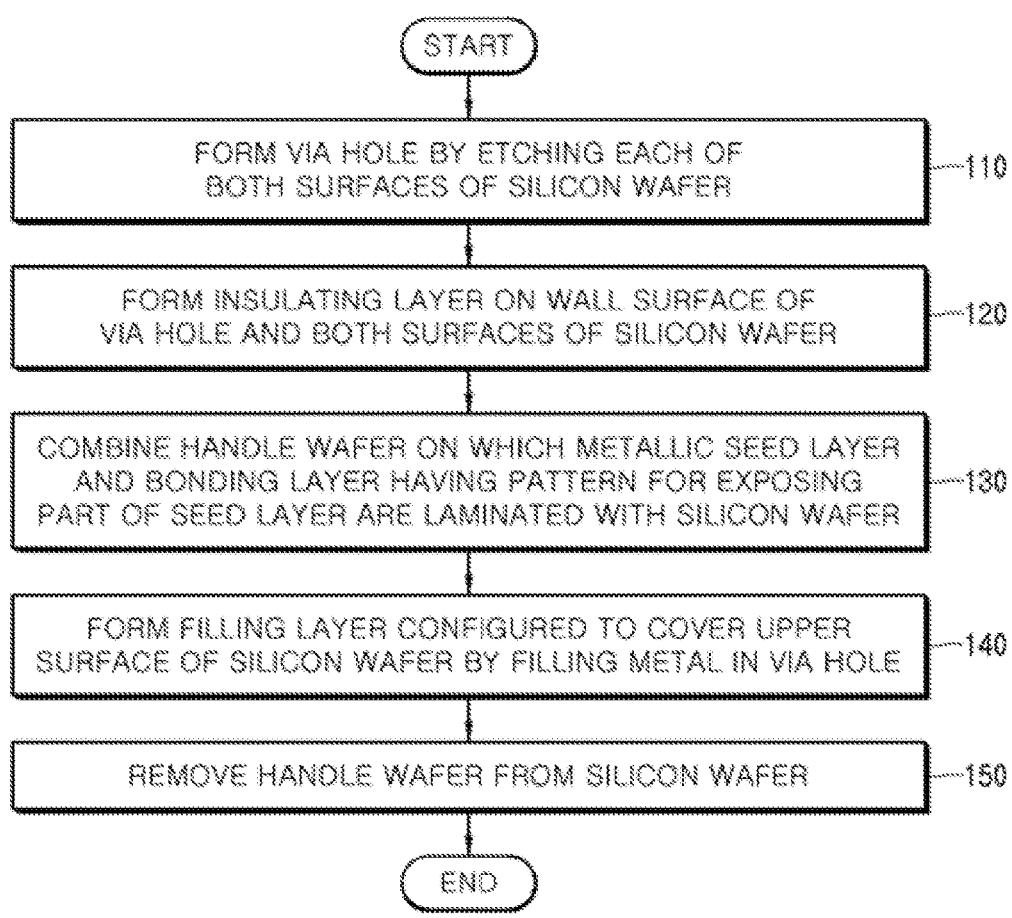
FIG. 1 is a flowchart provided to explain a method for manufacturing a sensor packaging according to an exemplary embodiment of the present disclosure.

The advantages and/or features of the present disclosure, and methods for accomplishing the same will be more clearly understood from exemplary embodiments described below with reference to the accompanying drawings. However, the present disclosure is not limited to the following exemplary embodiments but may be implemented in various different forms. The exemplary embodiments are provided only to complete disclosure of the present disclosure and to fully provide a person having ordinary skill in the art to which the present disclosure pertains with the category of the invention, and the present disclosure will be defined by the appended claims. Like reference numerals generally denote like elements throughout the present specification.

Hereinafter, exemplary embodiments of the present disclosure will be described in detail with reference to the accompanying drawings.

FIG. 1 is a flowchart provided to explain a method for manufacturing a sensor packaging according to an exemplary embodiment of the present disclosure, and FIG. 2 to FIG. 6 are manufacturing process diagrams provided to explain the method for manufacturing a sensor packaging according to an exemplary embodiment of the present disclosure. Herein, the term "sensor packaging" includes a sensor chip.

Prior to explanation of an exemplary embodiment of the present disclosure, a main substrate which includes a silicon wafer will be described as restricted to the silicon wafer and a sub-substrate which includes a handle wafer or a handle tape will be described as restricted to the handle wafer.

Figure 2:
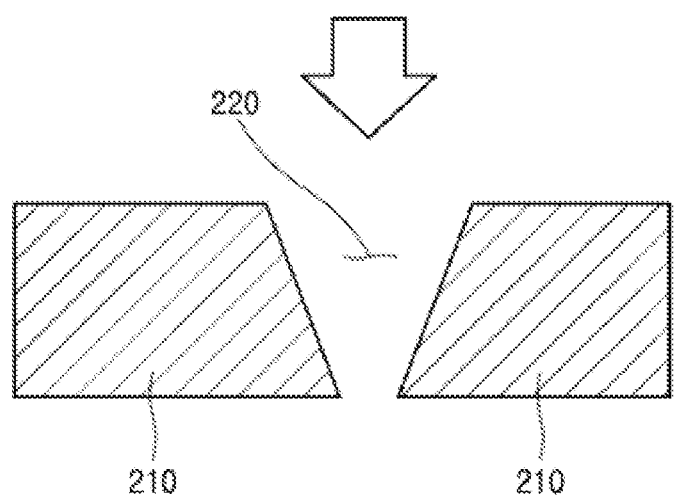
FIG. 2 to FIG. 6 are manufacturing process diagrams provided to explain the method for manufacturing a sensor packaging according to an exemplary embodiment of the present disclosure.

Firstly, referring to FIG. 1 and FIG. 2, a via hole 220 is formed to have a V shape in a silicon wafer 210 by etching one surface of the silicon wafer 210 in a process 110.

To this end, a Deep Reactive Ion Etching (DRIE) process may be performed to an upper surface of the silicon wafer 210 to make a hole in the upper surface of the silicon wafer 210, and, thus, the V-shaped via hole 220 can be formed.

Figure 3:
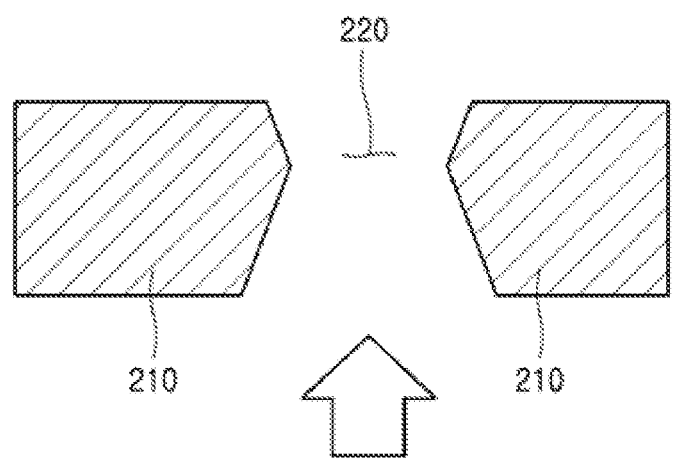

Then, referring to FIG. 1 and FIG. 3, the via hole is formed to have a reversed V shape in the silicon wafer 210 by etching the other surface of the silicon wafer 210 in the process 110.

To this end, the DRIE process may be performed to a lower surface of the silicon wafer 210 to make a hole in the lower surface of the silicon wafer 210, and, thus, the reversed V-shaped via hole 220 can be formed.

Herein, the reversed V-shaped via hole 220 and the V-shaped via hole 220 may be symmetric or not. As such, the degree of freedom in design of the DRIE process can be provided.

Through the above-described process, i.e., the process 110 and a process 120, the via hole 220 penetrating the silicon wafer 210 can be formed in the silicon wafer 210.

Herein, a wall surface of the via hole 220 may be formed as a bent slanted surface.

That is, if the corresponding positions on the both surfaces of the silicon wafer 210 are etched through the DRIE process, it is possible to form the via hole 220 including a wall surface formed as a bent slanted surface as illustrated in FIG. 3.

Figure 4:
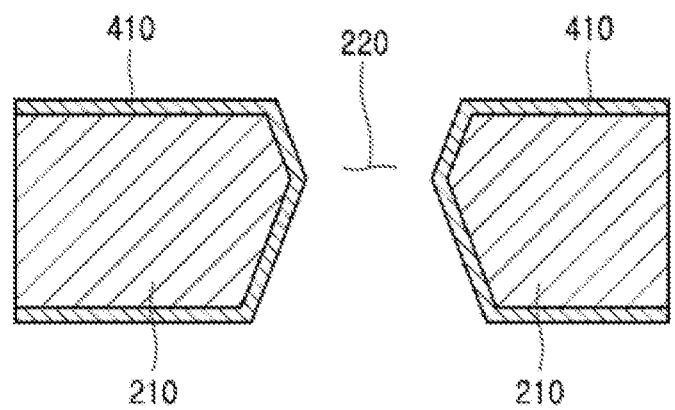

Then, referring to FIG. 1 and FIG. 4, an insulating layer 410 is formed on the wall surface of the via hole 220 and the both surfaces of the silicon wafer 210 in the process 120.

Herein, a polymer available for deposition at room temperature may be used for the insulating layer 410. Preferably, parylene may be used for the insulating layer 410.

Herein, the parylene is one of polymers which can be deposited at room temperature. When the parylene in a gaseous state meets a relatively cold surface of a deposition target, the parylene is cooled instantly and deposited on the surface of the target. Therefore, the parylene does not cause a problem of filling a via hole which is caused by a liquid polymer and a good step coverage can be obtained. Further, the parylene has a dielectric constant as high as 2.65 to 3.15 and has a breakdown voltage of 5000 V or more. As such, the parylene has excellent properties as an insulator.

The sensor chip according to an exemplary embodiment of the present disclosure and an ASIC chip can maintain room temperature and thus can significantly reduce the generation of a stress caused by heat which has been a problem.

Figure 5:
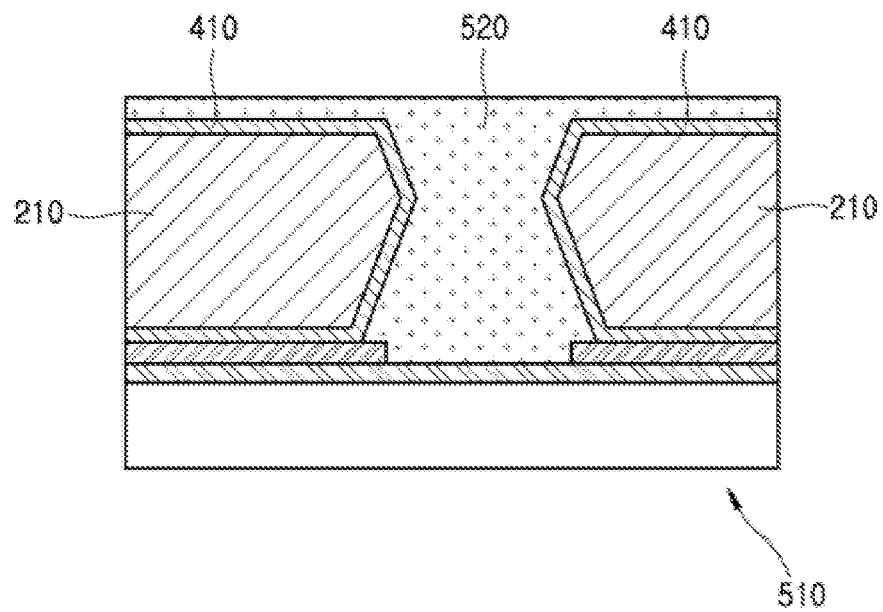

Then, referring to FIG. 1 and FIG. 5, a handle wafer 510 on which a metallic seed layer (see "820" in FIG. 10) and a bonding layer (see "910" in FIG. 10) having a pattern (see "1010" in FIG. 10) for exposing a part of the seed layer are laminated is combined with the silicon wafer 210 in a process 130.

In general, it is much easier to deposit a thin film including a metal layer on a horizontal surface than on a vertical surface. Therefore, in an exemplary embodiment of the present disclosure, a thin metal layer is deposited in advance on an upper surface of the handle wafer 510 which has been used only to assist a thinned silicon wafer and thus can be used as a seed layer.

In an exemplary embodiment of the present disclosure, a seed layer can be deposited on a horizontal surface as such and can also be deposited by sputtering or evaporation. Therefore, it is possible to control the properties of metal. Further, it is possible to solve a problem for a conventional seed layer which needs to be deposited on a wall surface of a via hole and thus is sensitive to a step coverage.

Also, in an exemplary embodiment of the present disclosure, parylene used for the insulating layer 410 is used to weakly bond the handle wafer 510 in order for the handle wafer 510 to be easily separated later. During the separation process, a polishing process such as chemical mechanical polishing (CMP) can be used as a part of the process if necessary.

The process of combining the handle wafer 510 with the silicon wafer 210 will be described in detail with reference to FIG. 7 to FIG. 10.

Then, referring to FIG. 1 and FIG. 5, a filling layer 520 configured to cover the upper surface of the silicon wafer 210 is formed by filling metal (e.g., copper) in the via hole 220 in a process 140.

Figure 6:
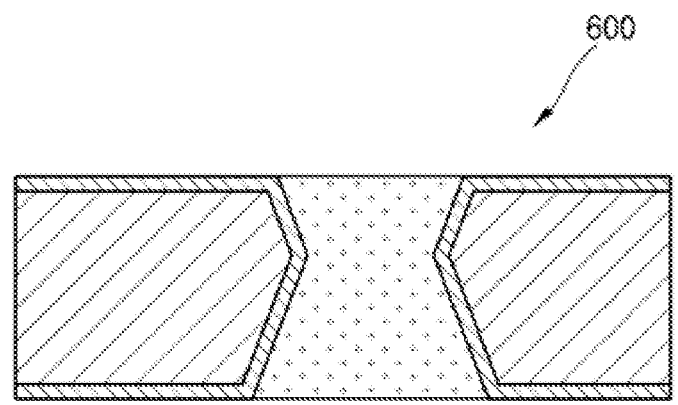

Then, referring to FIG. 1 and FIG. 6, the handle wafer 510 is removed from the silicon wafer 210 in a process 150. The filling layer covering the upper surface may be removed by CMP or the like.

In this case, the handle wafer 510 may be removed from the silicon wafer 210 using a chemical which dissolves only the specific polymer, or the handle wafer 510 may be removed from the silicon wafer 210 by polishing the handle wafer 510 through CMP.

Accordingly, the process of manufacturing a sensor packaging 600 according to an exemplary embodiment of the present disclosure can be completed. As the manufacturing process is completed, the sensor packaging 600 may include the silicon substrate 210, the via hole 220 penetrating the both surfaces of the silicon substrate 210 and including a wall surface formed as a bent slanted surface, the insulating layer 410 formed on the wall surface of the via hole 220 and the both surfaces of the silicon substrate 210, and the filling layer 520 formed by being filled in the via hole 220.

According to an exemplary embodiment of the present disclosure, the method can be applied not only to integration of the sensor packaging 600 and the ASIC chip but also to integration of a plurality of sensor packagings 600. Further, according to an exemplary embodiment of the present disclosure, a special new process is not needed and the cost of materials is low. Thus, it is possible to reduce the processing or production cost. Also, a high-temperature process is not included. Thus, it is possible to minimize a problem caused by heat.

Meanwhile, the manufacturing methods used in an exemplary embodiment of the present disclosure are not dependent on each other and thus can be all applied to a single sensor packaging 600 or can be selectively applied thereto.

Figure 7:
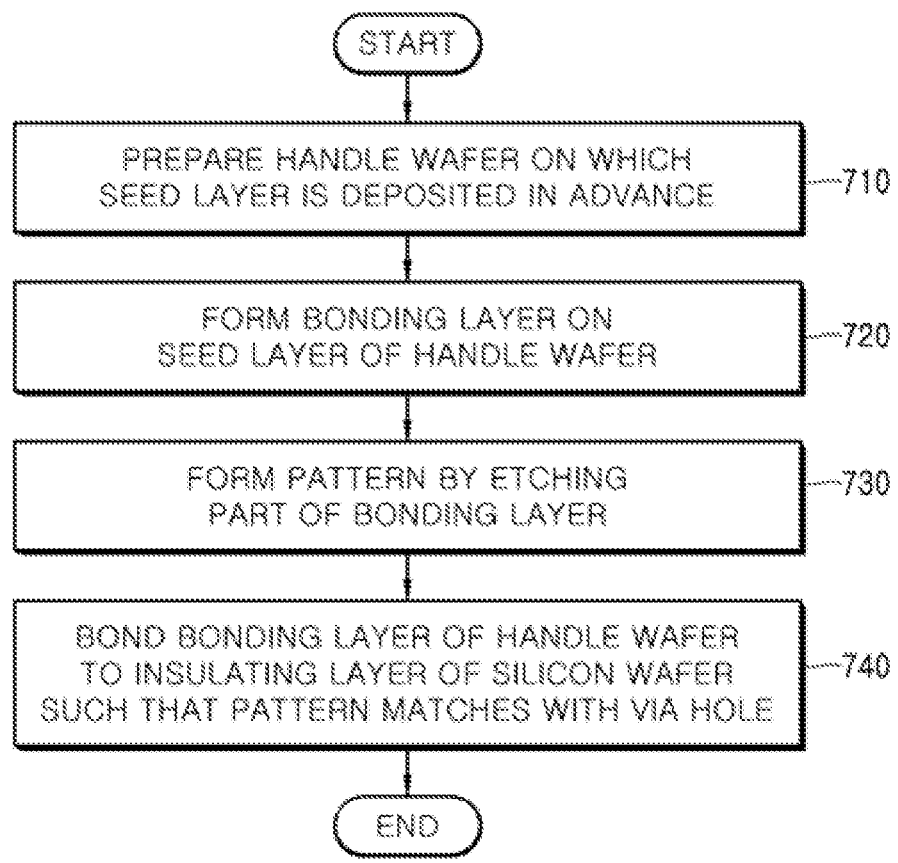
FIG. 7 is a flowchart provided to explain a process of combining a handle wafer with a silicon wafer according to an exemplary embodiment of the present disclosure.
Figure 8:
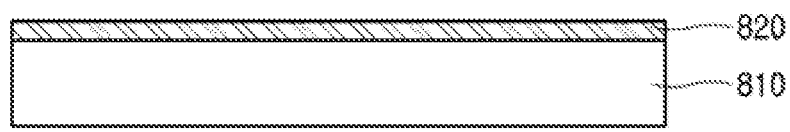
FIG. 8 to FIG. 10 are manufacturing process diagrams illustrating the process of FIG. 7.
Figure 9:
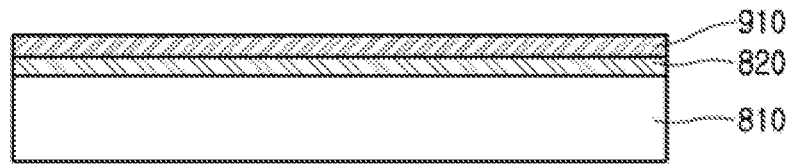
Figure 10:
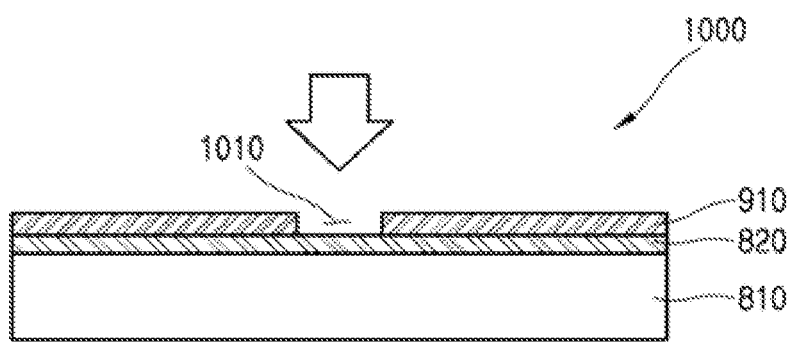

FIG. 7 is a flowchart provided to explain a process of combining the handle wafer with the silicon wafer according to an exemplary embodiment of the present disclosure, and FIG. 8 to FIG. 10 are manufacturing process diagrams illustrating the process of FIG. 7.

Firstly, referring to FIG. 7 and FIG. 8, a handle wafer 810 on which a metallic seed layer 820 is deposited in advance is prepared in a process 710.

Otherwise, the handle wafer 810 including the seed layer 820 may be prepared by depositing the seed layer 820 on the handle wafer 810.

Then, referring to FIG. 7 and FIG. 9, a bonding layer 910 is formed on the seed layer 820 of the handle wafer 810 in a process 720.

Herein, the bonding layer may be formed of a polymer including parylene, polydimethylsiloxane (PDMS), polymethyl methacrylate (PMMA), SU8, photoresist, and the like.

Then, referring to FIG. 7 and FIG. 10, a pattern 1010 for exposing a part of the seed layer 820 is formed by etching a part of the bonding layer 910.

Accordingly, a completely manufactured handle wafer 1000 to be combined with the silicon wafer (see "210" in FIG. 5) can be prepared.

Then, referring to FIG. 7 and FIG. 10, the bonding layer 910 of the completely manufactured handle wafer 1000 and the insulating layer (see "410" in FIG. 5) of the silicon wafer are aligned and bonded such that the pattern 1010 of the completely manufactured handle wafer 1000 matches with the via hole (see "220" in FIG. 4) of the silicon wafer.

Accordingly, the completely manufactured handle wafer 1000 can be combined with the silicon wafer.

Meanwhile, in another exemplary embodiment, the pattern 1010 may be formed after or at the same time when the bonding layer 910 is deposited on the seed layer 820.

EXAMPLE (1) Bidirectional Etching Process

The bidirectional etching process corresponds to FIG. 2 and FIG. 3. DRIE is not performed in one direction, but performed sequentially from above and below. When the DRIE is performed in a general way, there is a certain ratio between the width and the depth of a via hole. In order to increase the ratio of the depth to the width, special process condition needs to be developed.

However, it does not matter if the bidirectional etching process employs a general DRIE process since the thickness of a silicon wafer to be etched by unidirectional DRIE is reduced by more than half. Therefore, the DRIE can be simplified, and, thus, the development of process can focus on solving the scalloping problem. Also, such a V-shaped vertical surface results in an oblique exposed surface rather than a vertical exposed surface and thus may be useful later in depositing a passivation insulator and depositing a metallic seed layer.

In most fields, such as memory semiconductor field, using a through silicon via (TSV), wafers as thin as 10 to 100 μm or less are used. However, in most sensor chips, wafers as thick as 300 μm or more are used. Therefore, a thickness to be etched is increased, and, thus, a diameter of a via hole is necessarily increased.

The present method is conceived to form a few via holes having a large diameter on the basis of the fact that a sensor chip has a small number of interconnects. Further, the wide via hole can rapidly reduce a parasitic resistance/impedance.

(2) Low-temperature Insulator Process

The low-temperature insulator process corresponds to FIG. 4. A low-temperature process is needed to reduce a stress within a sensor chip and an ASIC chip. However, plasma enhanced chemical vapor deposition (PECVD) and low pressure chemical vapor deposition (LPCVD) require a high temperature of 400 to 600° C. and 600° C. or more, respectively, and thus are not suitable therefor.

Parylene can be deposited at room temperature and has an excellent step coverage on a horizontal surface and a vertical surface as can be seen from the drawings. Therefore, parylene can be deposited closely on a wall surface of a via hole formed in the "(1) bidirectional etching process".

Further, parylene has an excellent dielectric constant and a breakdown voltage of 3000 volts (V) or more and thus can be used as an excellent insulating layer. Further, if a high-temperature parylene (parylene HT) is used as necessary, it is stable at a temperature of 300° C. or more and thus can prepare for a high temperature which may be generated in an integrated system.

(3) Handle Wafer Process

The handle wafer process corresponds to FIG. 8 to FIG. 10. When a handle wafer is prepared, a metallic seed layer is deposited in advance. Since the seed layer is deposited in advance on the handle wafer, any method such as sputtering, evaporation, and the like may be used and any problem caused by heat does not occur.

A polymer is deposited on the seed layer. The polymer may employ various kinds of polymers such as parylene, PDMS, PMMA, SU8, photoresist, and the like as long as a pattern can be formed therein. As can be seen from the drawings, the pattern may be formed by etching the polymer after the polymer is deposited, or may be formed at the same time when the polymer is deposited. The polymer on the handle wafer is to be bonded to the sensor chip wafer manufactured in the "(2) low-temperature insulator process" and including a polymer on its both surfaces.

(4) Finishing Process

As can be seen from FIG. 5 and FIG. 6, a system is prepared by bonding the sensor chip manufactured by the "(2) low-temperature insulator process" to the handle wafer manufactured in the "(3) handle wafer process" and metal is grown by electroplating on the basis of the seed layer and thus fills the via hole.

Then, the handle wafer needs to be removed. In this case, the handle wafer can be removed using a chemical which dissolves only a specific polymer. Further, the handle wafer may be removed by polishing such as CMP.

Meanwhile, the embodiments have been described specifically in the detailed description of the invention. However, it is obvious that various modifications can be made without departing from the scope of the present disclosure. Therefore, the scope of the present disclosure is not limited to the embodiments described above but should be defined by the following claims and equivalents thereof.

Although the present disclosure has been described by limited exemplary embodiments and drawings in the exemplary embodiment of the present disclosure as described above, the present disclosure is not limited to the exemplary embodiment. Various modifications and changes can be made by a person having a ordinary skill in the art from the descriptions above. Therefore, the spirit of the present disclosure is defined only by the appended claims, and encompasses all modifications and equivalents that fall within the scope of the appended claims.

The invention claimed is:

1. A method for manufacturing a sensor packaging, the method comprising:
   forming a via hole penetrating a main substrate by etching each of both surfaces of the main substrate;
   forming an insulating layer on a wall surface of the via hole and the both surfaces of the main substrate;
   combining a sub-substrate on which a metallic seed layer and a bonding layer having a pattern for exposing a part of the seed layer are laminated with the main substrate;
   forming a filling layer configured to cover an upper surface of the main substrate by filling metal in the via hole; and
   removing the sub-substrate from the main substrate.

2. The method for manufacturing a sensor packaging of claim 1, wherein the forming of a via hole includes:
   forming the via hole by performing Deep Reactive Ion Etching (DRIE) to each of an upper surface and a lower surface of the main substrate.

3. The method for manufacturing a sensor packaging of claim 1, wherein the wall surface of the via hole is formed as a bent slanted surface.

4. The method for manufacturing a sensor packaging of claim 1, wherein the forming of an insulating layer includes:
   forming the insulating layer using a polymer which is available for deposition at room temperature.

5. The method for manufacturing a sensor packaging of claim 4, wherein the polymer includes parylene.

6. The method for manufacturing a sensor packaging of claim 1, wherein the combining of a sub-substrate with the main substrate includes:
   preparing the sub-substrate on which the seed layer is deposited in advance;
   forming the bonding layer on the seed layer of the sub-substrate;
   forming the pattern by etching a part of the bonding layer; and
   combining the sub-substrate with the main substrate by aligning and bonding the bonding layer of the sub-substrate and the insulating layer of the main substrate such that the pattern matches with the via hole.

7. The method for manufacturing a sensor packaging of claim 6, wherein the bonding layer is formed of a polymer including at least one of parylene, polydimethylsiloxane (PDMS), polymethyl methacrylate (PMMA), SU8, photoresist, and the like.

8. The method for manufacturing a sensor packaging of claim 6, wherein the pattern is formed after or at the same time when the bonding layer is deposited on the seed layer.

9. The method for manufacturing a sensor packaging of claim 1, wherein the main substrate includes a silicon wafer, and the sub-substrate includes a handle wafer or a handle tape.

* * * * *